United States Patent
Shima et al.

[11] Patent Number: 6,080,998
[45] Date of Patent: Jun. 27, 2000

[54] AMORPHOUS SILICON GERMANIUM THIN FILM AND PHOTOVOLTAIC ELEMENT

[75] Inventors: Masaki Shima, Uji; Toshihiro Kinoshita, Katano; Masao Isomura, Tsukuba, all of Japan

[73] Assignee: Sanyo Electric Co., Ltd., Osaka, Japan

[21] Appl. No.: 09/030,691

[22] Filed: Feb. 25, 1998

[30] Foreign Application Priority Data

Feb. 27, 1997 [JP] Japan ................................. 9-44190

[51] Int. Cl.[7] .................................................. H01L 29/04
[52] U.S. Cl. .................. 257/55; 257/63; 257/77; 257/440; 438/87; 438/96; 252/501.1; 136/249; 136/258
[58] Field of Search .................. 257/55, 63, 77, 257/440, 458; 438/87, 96; 252/501.1, 504; 136/249, 258

[56] References Cited

U.S. PATENT DOCUMENTS 5,084,777 1/1992 Slobodin ..................................... 359/67

OTHER PUBLICATIONS

A. Terakawa et al.; Optimization of a–SiGe:H Alloy Composition for Stable Solar Cells; Jpn. J. Appl. Phys. vol. 34 (1995), Part 1, No. 4A, Apr. 1995, pp. 1741–1747.

Y. Hishikawa et al.; Interference–Free Determination of the Optical Absorption Coefficient and the Optical Gap of Amorphous Silicon Thin Films; Japanese Journal of Applied Physics, vol. 30, No. 5, May 1991, pp. 1008–1014.

L. Yang et al.; The Effect of Hydrogen Dilution on the Deposition of Sige alloys and the Device Stability: Mat. Res. Soc. Symp. Proc. vol. 219, ©1991 Materials Research society, pp. 259–264.

*Primary Examiner*—Valencia Martin-Wallace
*Attorney, Agent, or Firm*—W. F. Fasse; W. G. Fasse

[57] ABSTRACT

An amorphous silicon germanium thin film is disclosed which contains hydrogen and germanium in concentrations of 5–10 atomic percent and 40–55 atomic percent, respectively for exhibiting the optical gap in the range of 1.30–1.40 eV. Also disclosed is a photovoltaic element incorporating the amorphous silicon germanium thin film.

10 Claims, 8 Drawing Sheets

AMORPHOUS SILICON GERMANIUM THIN FILM AND PHOTOVOLTAIC ELEMENT

BACKGROUND OF THE INVENTION

1. Field of the Invention

The present invention relates to an amorphous silicon germanium thin film and a photovoltaic element incorporating the amorphous silicon germanium thin film.

2. Description of Related Art

Amorphous semiconductor thin films, such as amorphous silicon films, have been conventionally employed as materials permitting easy and inexpensive fabrication of wide-area semiconductor elements. One well-known technique to form the amorphous semiconductor thin films is a plasma CVD technique. Also, one well-known semiconductor element incorporating the amorphous semiconductor thin film is a photovoltaic element which converts optical energy to electrical energy.

The photovoltaic element is desired to efficiently convert optical energy to electrical energy, and various studies have been directed to improving its energy conversion efficiency. One known technical measure to successfully improve such an energy conversion efficiency is a stacked solar cell. The stacked solar cell has a multilayer structure consisting of a plurality of power generating unit structures in an attempt to take effective advantage of a solar spectrum, and the semiconductor materials employed for respective photovoltaic unit structures are assembled in such a manner to differentiate their respective optical band gaps. For example, amorphous silicon or amorphous silicon carbide having a relatively large optical band gap is employed to constitute the photovoltaic unit structures located closer to a light incidence plane, and amorphous silicon germanium having a smaller optical gap relative to amorphous silicon is employed to constitute the photovoltaic unit structures located remoter from the light incidence plane. The stacked solar cell thus assembled can rely on the amorphous silicon germanium photovoltaic layer to absorb lights at longer wavelengths covering an infrared region which are difficult for amorphous silicon to absorb. This enables the stacked solar cell to efficiently absorb the solar light for power generation.

It is generally known that when desired to form the silicon germanium thin film with fine film properties by a plasma CVD technique, a substrate temperature must be elevated during film formation to reduce the hydrogen content in the resulting film to a certain extent (Jpn. J. Appl. Phys., Vol. 34 (1995), pp. 1741–1747). However, in fabricating the stacked solar cell on a translucent substrate, e.g. a glass substrate, the photovoltaic unit structure comprised of the amorphous silicon germanium layer must be formed on the photovoltaic unit structure comprised of the amorphous silicon layer. In such a case, the substrate temperature elevated during formation of the amorphous silicon germanium thin film acts to subject the underlying amorphous silicon layer to a problematic heat damage. Specifically, the substrate temperature elevated during formation of the amorphous silicon germanium thin film allows a dopant, e.g. boron in a p-type amorphous silicon layer within the previously formed, underlying photovoltaic unit structure, to diffuse into an i-type amorphous silicon layer, or allows a dopant in a transparent electrode layer to diffuse into the p-type amorphous silicon layer. This leads to the reduction in performance of the solar cell layer comprised of the amorphous silicon layer. As a result, it becomes difficult to fabricate high-quality stacked solar cells.

On the other hand, as the substrate temperature during formation of the amorphous silicon germanium thin film is lowered in an attempt to reduce the potential heat damage given to the underlayer in the stacked solar cell, the decreased film property of amorphous silicon germanium results, and again makes it difficult to fabricate the stacked solar cells of high quality.

SUMMARY OF THE INVENTION

The present invention is directed to solving the above-described problems, and one of its objects is to provide a method which is capable of fabricating an amorphous silicon germanium thin film having excellent film properties at a relatively low substrate temperature. It is another object of the present invention to provide an amorphous silicon germanium thin film which can be obtained by utilizing the present method, as well as a photovoltaic element incorporating the amorphous silicon germanium thin film.

The method of the present invention is characterized in that a material gas is diluted with a diluent gas and that an amorphous silicon germanium thin film is fabricated on a substrate by a plasma CVD precess. In the present method, the amorphous silicon germanium thin film is fabricated under such characteristic conditions that a material gas dilution ratio, as determined by a ratio of the diluent gas to a silicon-containing component gas in the material gas, is controlled at 25 or higher, and the substrate temperature is set at 200° C. or lower.

In the present invention, the material gas dilution ratio is determined by the ratio of the diluent gas to the silicon-containing component gas in the material gas, as described above. Accordingly, in an exemplary case where a silane material gas, such as a monosilane or disilane gas, is used as the silicon-containing component gas in the material gas, the material gas is diluted with the diluent gas, so that the ratio of the diluent gas to the silane material gas is set at not less than 25. Representative of the diluent gases are a hydrogen gas and inert gases such as helium, argon and xenon. A mixture of the hydrogen gas and the inert gas may be employed.

In the present invention, the material gas dilution ratio, with respect to the silicon-containing component gas incorporated therein, is not less than 25, more preferably, not less than 25 but not greater than 200. As the dilution ratio falls below 25, it becomes increasingly difficult to attain the effect of the present invention, i.e., the fabrication of the amorphous silicon germanium thin film with excellent film properties at a relatively low substrate temperature becomes increasingly difficult. On the other hand, as it increases excessively, a deposition rate decreases so that a production efficiency also falls to a level leading to an industrial disadvantage. Furthermore, the resulting silicon germanium thin film may possibly be crystallized.

In the present invention, the substrate temperature is controlled at 200° C. or lower. If the substrate temperature exceeds 200° C., it becomes increasingly difficult to attain the effect of the present invention, i.e., the fabrication of the amorphous silicon germanium thin film with excellent film properties at a relatively low substrate temperature becomes increasingly difficult. That is, in fabricating the stacked solar cell, the elevated substrate temperature applied during film formation of amorphous silicon germanium gives heat damage to the underlying solar cell layer, as mentioned above. In the present invention, the substrate temperature set in forming the amorphous silicon germanium thin film is preferably in the range of 140° C.–200° C., more preferably in the range of 180° C.–200° C. The excessively lowered substrate temperature possibly causes industrial disadvantages such as an increasing difficulty in thin film formation or a decreasing deposition rate.

In accordance with the method of the present invention, the amorphous silicon germanium thin film is deposited on a p-type or n-type electrically conductive semiconductor, for example, if formed as a photovoltaic layer of the photovoltaic element.

One exemplary condition for thin film formation, in accordance with one embodiment of the present invention, is given in the following Table 1.

TABLE 1

| Substrate Temperature (° C.) | | 180–200 |
|---|---|---|
| RF Power Density (mW/cm$^2$) | | 10–40 |
| Gas Flow Rate (sccm) | Monosilane | 5–50 |
| | Germane | 0.1–10 |
| | Hydrogen | 125–10000 |
| H$_2$:SiH$_4$ | | 25–200 |

Polysilane, such as disilane, may be employed as the material gas in place of monosilane. Although the hydrogenated gas is employed as the material gas, the present invention is not limited thereto, and a halogenated gas may be employed. Also, although the hydrogen gas is specifically employed as the diluent gas at thin-film formation as specified above, the diluent gas may be an inert gas such as helium, argon or xenon, as mentioned above. A mixture of hydrogen and inert gases may also be employed as the diluent gas.

Although uncertain as to how the amorphous silicon germanium thin film with fine film properties can be formed at a relatively low substrate temperature, in accordance with the present invention, it is believed due to the followings, without being bound by theory.

When the material gas dilution ratio is controlled at 25 or higher, in accordance with the present invention, a fairly large amount of hydrogen radicals or ions, or ions from inert gases, which are not direct contributors to film formation, are generated in plasma. These radicals or ions strike a growth surface of a thin film to impart energy to silane or germane radicals, i.e. to contributors to film formation at the growth surface of thin film. Such an energy serves to compensate for the energy loss due to the lowered substrate temperature, so that a high-quality amorphous silicon germanium thin film can be formed even at such a relatively low substrate temperature without sacrificing its film properties.

As described above, according to the present invention, it is believed that the hydrogen radicals or ions, or the others produced by diluting the material gas at a high ratio strike the thin film growth surface to consequently impart excellent film properties to the resulting thin film. However, the excessive impact of the hydrogen radicals or ions, or the others onto the growth surface of thin film is considered likely to adversely affect the resulting film properties. In such a case, the impact of the hydrogen radicals or ions, or the others can be suitably lessened by applying a positive bias of not greater than 200 V to the substrate concurrently with formation of the amorphous silicon germanium thin film. Alternatively, a metallic mesh may be disposed above the substrate to which a positive bias of not greater than 200 V is applied during formation of the amorphous silicon germanium thin film.

In the above-described particular embodiment, the positive bias of not greater than 200 V is applied to the substrate or metallic mesh. The positive bias applied is more preferably in the 50–150 V range. As the applied positive bias increases excessively, the activation of the growth surface of thin film by the hydrogen radicals or ions, or the others is markedly lessened to possibly fail to attain the effect of the present invention, i.e. to form the amorphous silicon germanium thin film with excellent film properties.

The amorphous silicon germanium thin film obtained according to the present method shows a trend of having a reduced hydrogen content and an increased germanium content compared to conventional amorphous silicon germanium thin films exhibiting a comparable optical gap which are formed using elevated temperatures.

Specifically, the amorphous silicon germanium thin film of the present invention exhibits an optical gap in the range of 1.30–1.40 eV, and contains hydrogen and germanium in concentrations of 5–10 atomic percent and 40–55 atomic percent, respectively. More specifically, the optical gap is in the range of 1.32–1.36 eV, and the hydrogen and germanium content ranges are 5–8 atomic percent and 45–55 atomic percent, respectively. Also, the amorphous silicon germanium thin film suitable for use in the stacked solar cell exhibits an optical gap in the range of 1.30–1.40 eV, more specifically in the range of 1.32–1.36 eV. The optical gap as herein used refers to the optical gap determined from a plot of hv vs. $(\alpha h v)^{1/3}$ wherein h is the plank constant, v is the frequency, and $\alpha$ is the absorption coefficient. The details on the determination of the optical gap from the plot of cube root are described in the publication, Jpn. J. Appl. Phys., vol. 30(1991), p. 1008.

An attempt to utilize the conventional method to form the amorphous silicon germanium thin film having a reduced hydrogen content and an increased germanium content, which are comparable to those of the present thin film, results in the amorphous silicon germanium thin film with a narrower optical gap relative to the prescribed property. However, the amorphous silicon germanium thin film of the present invention has a comparable optical gap and comparable or superior photoconductivity to the respective prescribed properties. This is believed due to the different bonding configurations of germanium atoms in the thin film from those produced by the conventional method.

The photovoltaic element of the present invention is the photovoltaic element incorporating the amorphous silicon germanium thin film of the present invention.

The photovoltaic element of the present invention characteristically has a multilayer structure formed of a p-type semiconductor thin film layer, an i-type semiconductor thin film layer and an n-type semiconductor thin film layer, and at least one of those thin film layers is comprised either of the amorphous silicon germanium thin film of the present invention or of the amorphous silicon germanium thin film manufactured by the method of the present invention.

In a narrowed embodiment of the present invention, a stacked photovoltaic element is provided which stacks two or more of a power generating unit structure comprised of a p-type thin film semiconductor layer, an i-type thin film semiconductor layer and an n-type thin film semiconductor layer. At least one thin film semiconductor layer in any of at least one power generating unit structure succeeding outwardly from the power generating unit structure closest to the light incidence plane is comprised either of the amorphous silicon germanium thin film of the present invention or of the amorphous silicon germanium thin film manufactured by the method of the present invention.

The amorphous silicon germanium thin film of the present invention, as well as the amorphous silicon germanium thin film manufactured by the method of the present invention, have excellent film properties and are capable of attaining high energy conversion efficiencies.

Also, the stacked photovoltaic element can be fabricated by employing the amorphous silicon germanium thin film of the present invention for at least one thin film semiconductor layer in any of at least one photovoltaic unit structure succeeding outwardly from the photovoltaic unit structure closest to the light incidence plane, without giving heat damage to one or more photovoltaic unit structure which underlies any of at least one photovoltaic unit structure incorporating at least one amorphous silicon germanium thin film of the present invention. Therefore, a high energy conversion efficiency is attainable by the stacked photovoltaic element of the present invention.

DESCRIPTION OF THE PREFERRED EMBODIMENTS

Figure 1:
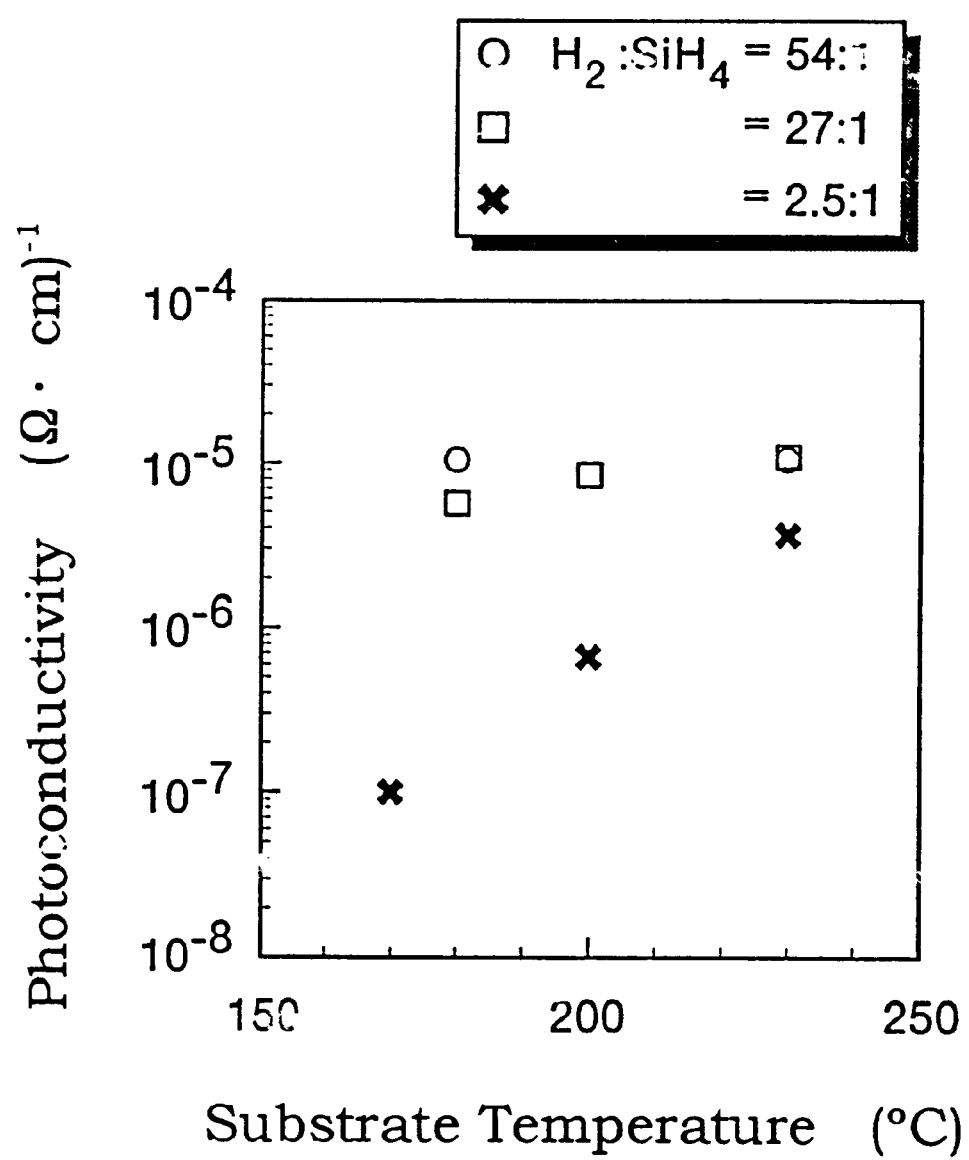
FIG. 1 is a graph showing a relationship between the substrate temperature and photoconductivity for the amorphous silicon germanium thin film formed in accordance with the present invention.

FIG. 1 is a graph of substrate temperature vs. photoconductivity $\sigma ph$ $(\Omega \cdot cm)^{-1}$ for the amorphous silicon germanium thin film which is formed using the highly diluted material gas and the plasma CVD process in accordance with the present invention. The marks with a circle (○) show the results when the dilution ratio $H_2:SiH_4=54:1$, and the marks with a square (□) show the results when the dilution ratio $H_2:SiH_4=27:1$. The flow rates of monosilane gas, as a material gas, and germane gas were 7.5 sccm (standard cubic centimeters per minute) and 0.5 sccm, respectively. The flow rate of hydrogen gas was varied within the range of 200–400 sccm to obtain the above-specified dilution ratios. In forming thin films, the substrate temperatures were set at 180° C., 200° C. and 230° C., respectively.

For comparative purposes, the results when the dilution ratio $H_2:SiH_4=2.5:1$ are shown in FIG. 1 by the marks with a cross (X), wherein the gas flow rates of monosilane, germane and hydrogen were 30 sccm, 2–3.2 sccm and 75 sccm, respectively, and the substrate temperatures were set at 170° C., 200° C. and 230° C., respectively.

In each case, the RF power density of 20 mW/cm$^2$ was employed.

As apparent from the results shown in FIG. 1, in the case where the dilution gas was diluted at higher ratios, the amorphous silicon germanium thin films formed with the relatively lower substrate temperatures, i.e. at 180° C. and 200° C., exhibit high photoconductivities. They are comparable or superior to the photoconductivity, shown in FIG. 1 by the mark with X, of the conventional amorphous silicon germanium thin film formed with the substrate temperature of 230° C.

Figure 2A:
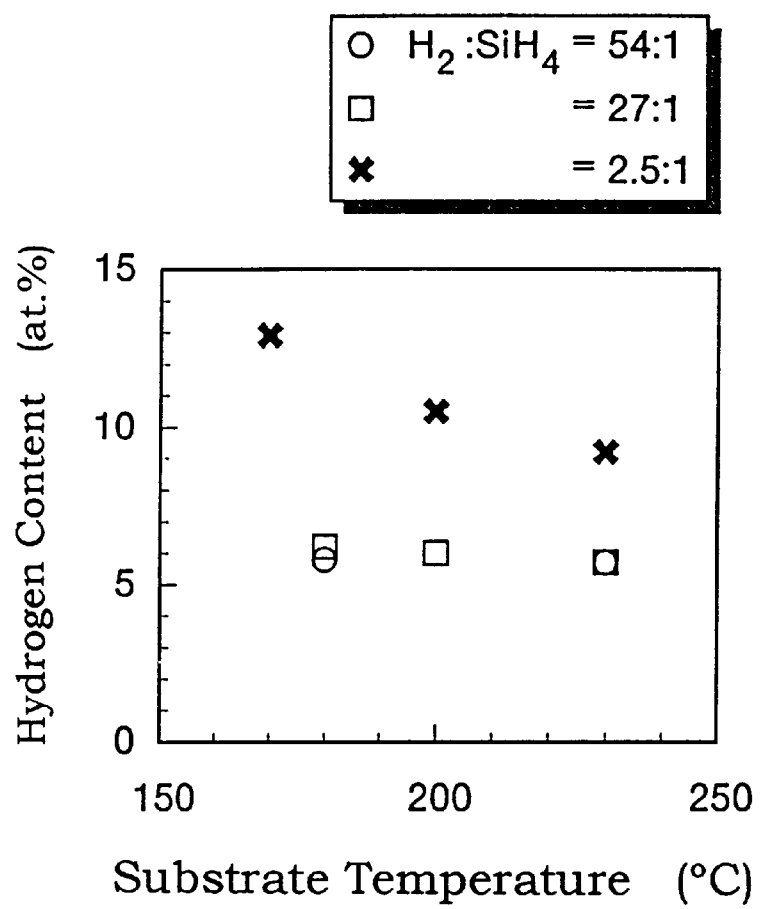
FIG. 2A is a graph showing the hydrogen content of the amorphous silicon germanium thin film formed in accordance with the present invention.
Figure 2B:
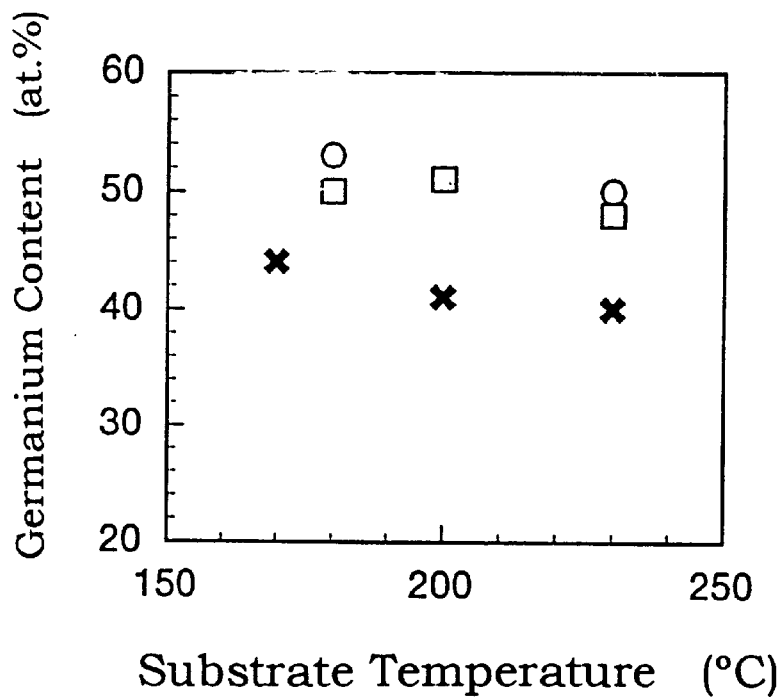
FIG. 2B is a graph showing the germanium content of the amorphous silicon germanium thin film formed in accordance with the present invention.

FIGS. 2A and 2B show the hydrogen and germanium contents, respectively, for the amorphous silicon germanium thin films which were formed with the thin film forming conditions employed to obtain data shown in FIG. 1. As can be seen from FIG. 2A, the amorphous silicon germanium thin films in accordance with the present invention, which were formed with the dilution ratios marked with ○ and □, as well as with the substrate temperatures not greater than 200° C., exhibit decreased hydrogen contents, i.e. within the range of 5–8 atomic percent, relative to the conventional amorphous silicon germanium thin films formed with the low dilution ratio marked with X.

As can also be seen from FIG. 2B, the amorphous silicon germanium thin films in accordance with the present invention exhibit increased germanium contents, i.e. within the range of 45–55 atomic percent, relative to the conventional amorphous silicon germanium thin films.

The amorphous silicon germanium thin films shown in FIGS. 2A and 2B all exhibit the optical gap of about 1.32 eV according to the above-described cube root plot. This corresponds to the 1.40 eV–1.45 eV range according to Tauc's plot, which is an optimum optical gap width for a lower photovoltaic layer of the stacked solar cell. In spite of exhibiting such an optimum optical band gap width, the amorphous silicon germanium thin films in accordance with the present invention demonstrate the decreased hydrogen contents and increased germanium contents relative to the conventional amorphous silicon germanium thin films. It is therefore believed that the amorphous silicon germanium thin film in accordance with the present invention is different from the amorphous silicon germanium thin films formed under conventional thin-film forming conditions, in terms of bonding configurations of germanium atoms.

The following Table 2 summarizes the data shown in FIGS. 1, 2A and 2B. In the column of photoconductivity of Table 2, "E" indicates exponent and therefore 1.05E-5 indicates $1.05 \times 10^{-5}$, for example.

TABLE 2

| $H_2:SiH_4$ | Substrate Temperature (° C.) | H Content (Atomic %) | Ge Content (Atomic %) | Photoconductivity $((\Omega \cdot cm)^{-1})$ |
|---|---|---|---|---|
| 54 | 180 | 5.8 | 53 | 1.05*E-5 |
| 54 | 230 | 5.7 | 50 | 1.05E-5 |
| 27 | 180 | 6.2 | 50 | 5.70E-6 |

TABLE 2-continued

| H$_2$:SiH$_4$ | Substrate Temperature (° C.) | H Content (Atomic %) | Ge Content (Atomic %) | Photoconductivity ((Ω · cm)$^{-1}$) |
|---|---|---|---|---|
| 27 | 200 | 6.0 | 51 | 8.51E-6 |
| 27 | 230 | 5.7 | 48 | 1.10E-5 |
| 2.5 | 170 | 12.9 | 44 | 1.00E-7 |
| 2.5 | 200 | 10.5 | 41 | 6.66E-7 |
| 2.5 | 230 | 9.2 | 40 | 3.63E-6 |

*E-5 = 1.0 × 10$^{-5}$

As can be appreciated from Table 2, the amorphous silicon germanium thin films incorporating hydrogen and germanium in the 5–7 atomic percent range and in the 45–55 atomic percent range, respectively, exhibit photoconductivities higher than 5E-6.

These results are obtained for those exhibiting optical gaps around 1.32 eV. Besides, the optimum hydrogen and germanium contents were demonstrated by experiments as being in the 5–10 atomic percent range and in the 40–55 atomic percent range, respectively, for those exhibiting optical gaps in the range of 1.30–1.40 eV, suitable for use in stacked solar cells.

More specifically, the optimum hydrogen and germanium contents were demonstrated by experiments as being in the 5–8 atomic percent range and in the 40–55 atomic percent range, respectively, for those exhibiting optical gaps in the range of 1.32–1.36 eV.

Figure 3:
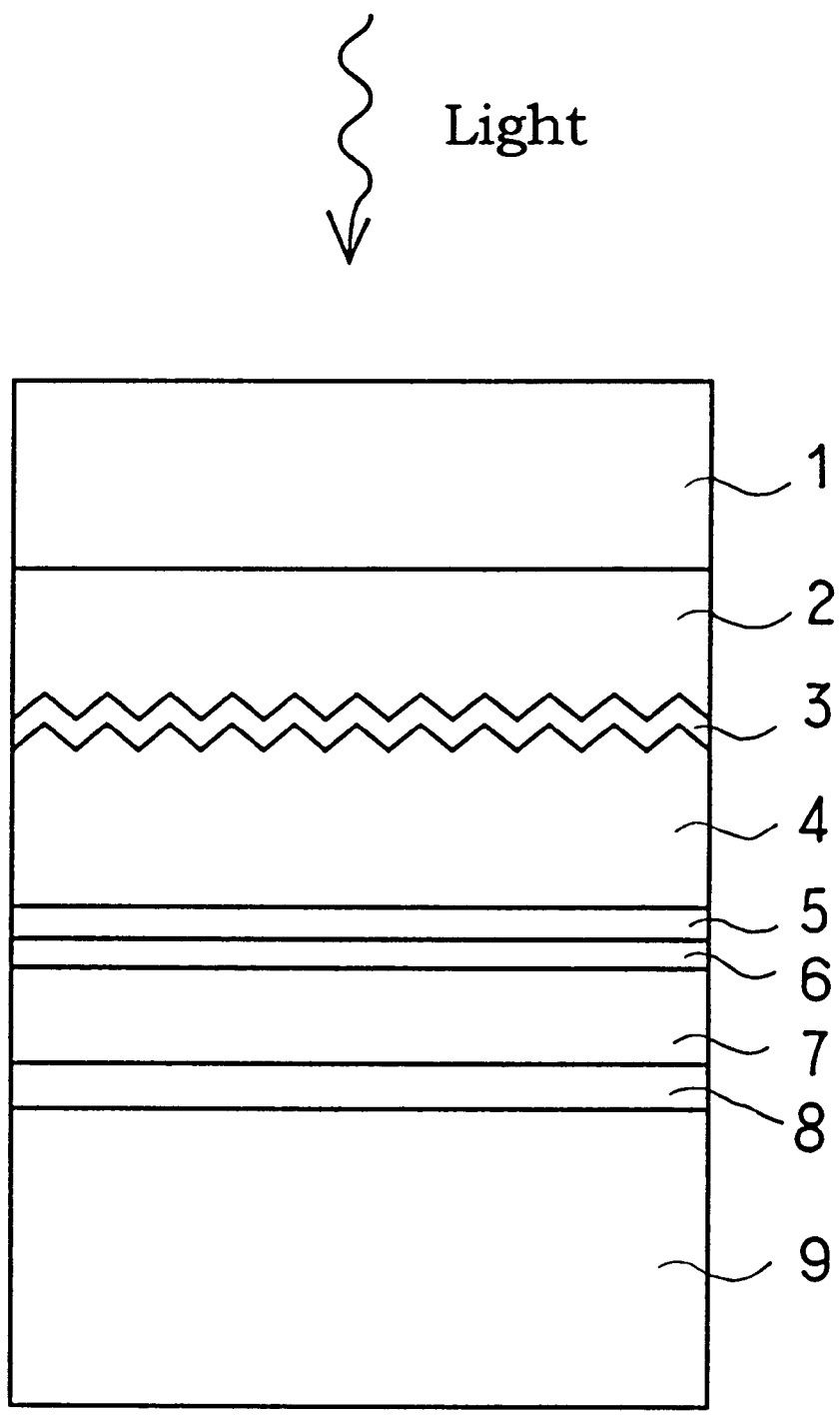
FIG. 3 is a schematic cross-sectional view of the stacked photovoltaic element incorporating the amorphous silicon germanium thin film in accordance with the present invention.

FIG. 3 is a cross-sectional view showing an exemplary dual-layer solar cell which includes a front cell having an a-Si:H (amorphous silicon) photovoltaic layer and a bottom cell having an a-SiGe:H (amorphous silicon germanium) photovoltaic layer. As shown in FIG. 3, formed on a glass substrate 1 is a transparent electrode 2 of tin oxide which has a textured surface. A p-type a-SiC:H layer 3 (100 Å thickness), an i-type a-Si:H layer 4 (1300 Å thickness) and an n-type a-Si:H layer 5 (100 Å thickness) are consecutively formed on the textured surface of transparent electrode 2 to constitute the front cell. A p-type a-Si:H layer 6 (100 Å thickness), an i-type a-SiGe:H layer 7 (1000 Å thickness) and an n-type a-Si:H layer 8 (100 Å thickness) are consecutively formed on the front cell to constitute the bottom cell. A rear surface metallic electrode 9 is formed on the n-type a-Si:H layer 8.

The semiconductor layers in the stacked solar cell shown in FIG. 3 were formed under the respective conditions given in the following Table 3 to fabricate a stacked solar cell.

As shown in Table 3, the amorphous silicon germanium thin films were formed with the material gas dilution ratio (with respect to silicon-containing component gas) of about 45 and the substrate temperature of 180° C. in Example 1, with the material gas dilution ratio of about 2.5 and the substrate temperature of 230° C. in Comparative Example 1, with the material gas dilution ratio of about 2.5 and the substrate temperature of 180° C. in Comparative Example 2, and with the material gas dilution ratio of about 54 and the substrate temperature of 230° C. in Comparative Example 3, respectively.

The four types of stacked solar cells thus fabricated were measured for initial characteristics of output parameters. The following Table 4 shows the open circuit voltage (Voc), the short circuit current (Isc), the fill factor (F.F.) and the conversion efficiency for each type of stacked solar cell.

TABLE 4

|  | Voc (V) | Isc (mA/cm$^2$) | F.F. | Conversion Efficiency (%) |
|---|---|---|---|---|
| Comp. Exp. 1 | 1.48 | 9.9 | 0.70 | 10.3 |
| Comp. Exp. 2 | 1.49 | 9.7 | 0.65 | 9.4 |
| Comp. Exp. 3 | 1.47 | 9.8 | 0.67 | 9.7 |
| Exp. 1 | 1.52 | 10.0 | 0.71 | 10.8 |

As can be clearly seen from Table 4, the stacked solar cell of Example 1, which has the amorphous silicon germanium thin film formed in accordance with the present method, exhibits a better F.F. as well as a relatively high conversion efficiency. This is believed due to the increased film property imparted to the amorphous silicon germanium thin film as employed for the photovoltaic layer in the bottom cell, which served to suppress the recombination of carriers produced in the photovoltaic layer upon its exposure to light.

In Comparative Example 3, the front cell is believed as having experienced heat damage due to the relative high substrate temperature of 230° C. applied during thin-film formation to bring about the decreased conversion efficiency relative to Example 1, as contrary to the expected formation of the amorphous silicon germanium thin film with excellent film properties.

Then, the four types of stacked solar cells fabricated were measured for output parameters after photodegradation under the condition corresponding to outdoor exposure for one year (500 mW/cm$^2$, 25° C., 160 minutes). The evaluated results are shown in the following Table 5.

TABLE 3

|  |  | Gas Flow Rate (sccm) | | | | Substrate | RF | |
|---|---|---|---|---|---|---|---|---|
|  |  | SiH$_4$ | GeH$_4$ | B$_2$H$_6$ H$_2$ (100 ppm) | PH$_3$ (1%) | Temperature (° C.) | Power (mW/cm$^2$) | Exp. No. |
| Front | p | 10 | — | 100 | 6 | — | 120 | 30 |  |
|  | i | 75 | — | — | — | — | 180 | 17 |  |
|  | n | 10 | — | 7 | — | 3 | 180 | 30 |  |
| Bottom | p | 10 | — | 100 | 6 | — | 120 | 30 |  |
|  | i | 30 | 3.2 | 75 | — | — | 230 | 20 | Comp. Exp. 1 |
|  | i | 30 | 2.6 | 75 | — | — | 180 | 20 | Comp. Exp. 2 |
|  | i | 7.5 | 0.5 | 400 | — | — | 230 | 20 | Comp. Exp. 3 |
|  | i | 7.5 | 0.5 | 400 | — | — | 180 | 20 | Exp. 1 |
|  | n | 10 | — | 7 | — | 3 | 180 | 30 |  |

TABLE 5

|  | Voc (V) | Isc (mA/cm²) | F.F. | Conversion Efficiency (%) |
| --- | --- | --- | --- | --- |
| Comp. Exp. 1 | 1.46 | 9.8 | 0.65 | 9.3 |
| Comp. Exp. 2 | 1.47 | 9.5 | 0.60 | 8.4 |
| Comp. Exp. 3 | 1.45 | 9.6 | 0.62 | 8.6 |
| Exp. 1 | 1.50 | 9.9 | 0.67 | 9.9 |

As shown in Table 5, the amorphous silicon germanium thin film of Example 1, fabricated in accordance with the present invention, exhibits the high F.F. and conversion efficiency even after stabilized (photodegraded) upon its exposure to light.

Next, the stacked solar cells having the construction of FIG. 3 were fabricated in the same manner as in Example 1, with the exceptions that the hydrogen gas flow rate was reduced to 200 sccm, the material gas dilution ratio was accordingly reduced to about 27, and the substrate temperature was varied to be at 180° C., 200° C., and 230° C., respectively. The amorphous silicon germanium thin film in each of the stacked solar cells thus obtained exhibits the optical gap of 1.32 eV. The stacked solar cells formed with various substrate temperatures were measured for initial conversion efficiency, as well as efficiency after exposure to light (stabilization) corresponding to outdoor exposure for one year. The results are shown in FIG. 4 and also in the following Table 6.

TABLE 6

| Substrate Temperature (° C.) | Initial Efficiency (%) | Efficiency After Stabilization (%) |
| --- | --- | --- |
| 180 | 10.7 | 9.8 |
| 200 | 10.6 | 9.6 |
| 230 | 9.7 | 8.6 |

Figure 4:
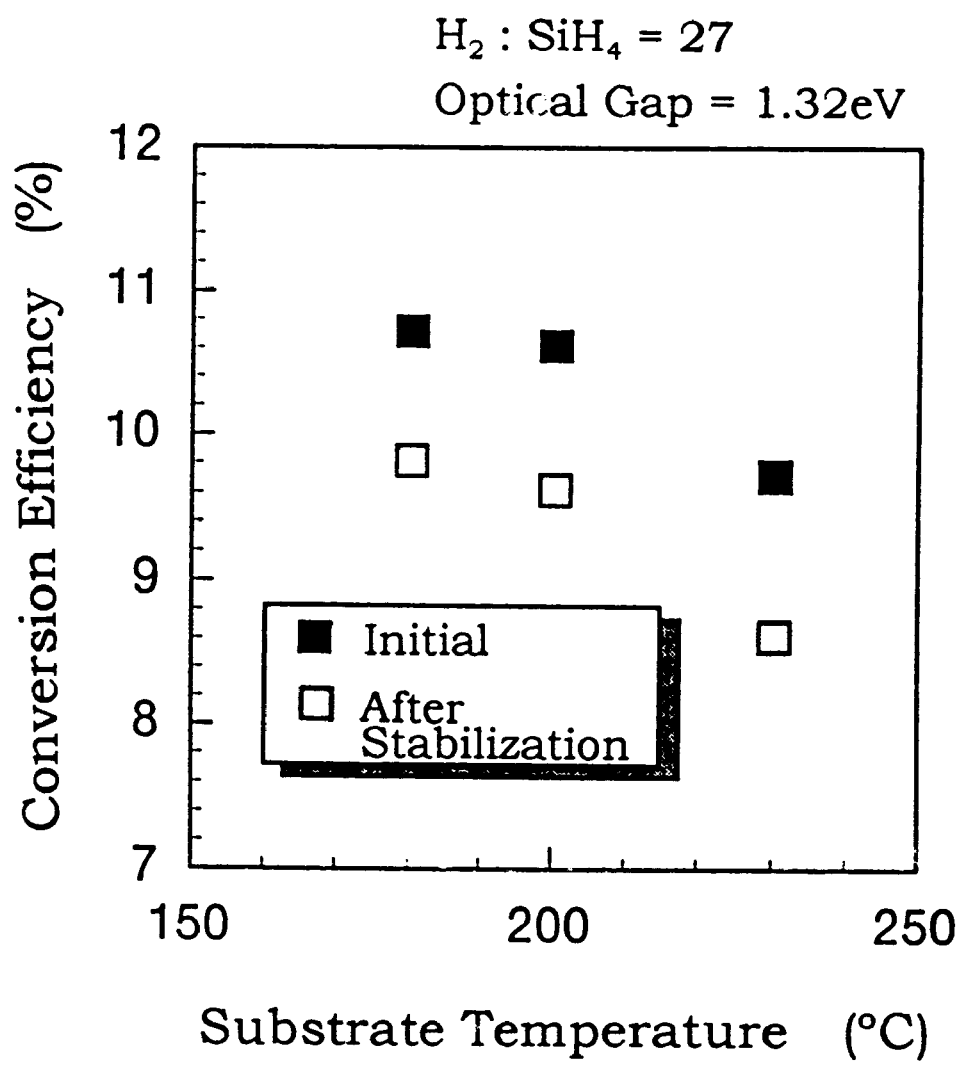
FIG. 4 is a graph showing a relationship between the substrate temperature at film formation and conversion efficiency for the stacked photovoltaic element incorporating the amorphous silicon germanium thin film in accordance with the present invention.

As can be appreciated from the results shown in FIG. 4 and Table 6, as the substrate temperature exceeds 200° C., the resulting stacked solar cell exhibits a marked reduction in conversion efficiency both initially and after stabilization. This is believed due to the substrate temperature beyond 200° C. which heat damaged the front cell, as discussed above.

Figure 5:
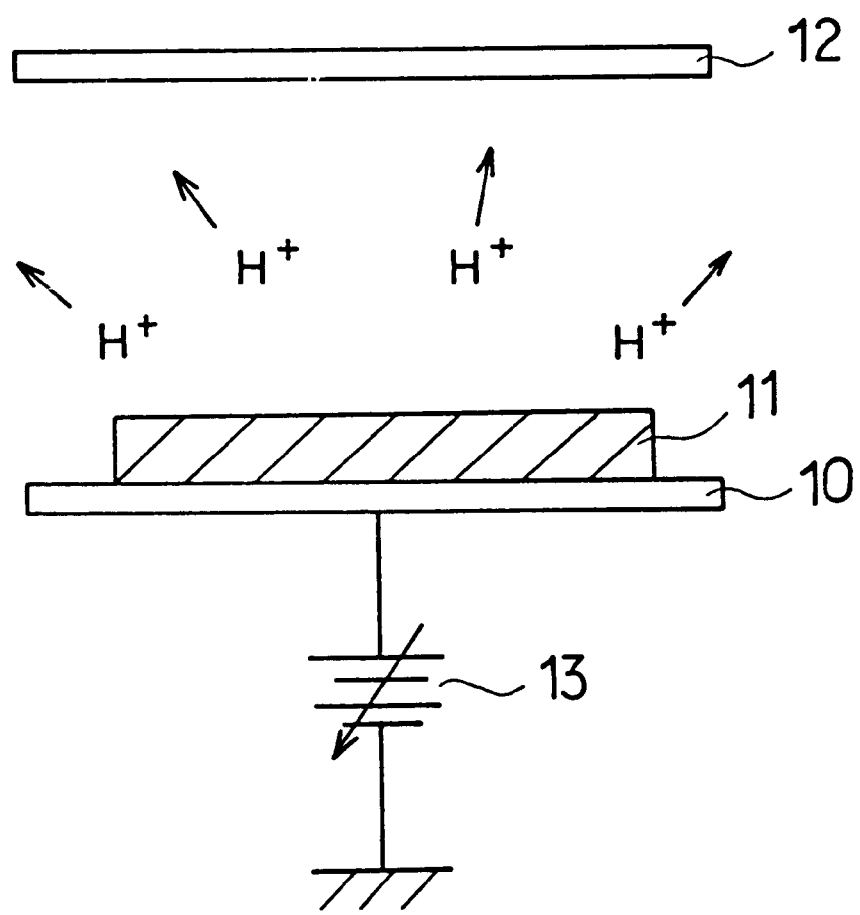
FIG. 5 is a schematic diagram showing the apparatus for applying the positive bias to the substrate for use in the method in accordance with the present invention.

FIG. 5 is a schematic diagram showing the apparatus for applying a positive bias to a substrate, for use in the method in accordance with the present invention. Referring to FIG. 5, the substrate 11 is placed on a substrate holder 11 which is connected to a plus (+) terminal of a DC power source 13. An RF power source (not shown) is connected to an electrode 12 for generating a plasma between the electrode and the substrate holder 10. In this particular embodiment, the positive bias is applied to the substrate holder 10, and accordingly to the substrate 11, to thereby cause repulsion of hydrogen ions which otherwise strike the substrate 11. This serves to reduce the occurrence of their striking to thereby reduce damages to the substrate, so that the reduction in film properties of the resulting thin film can be suppressed. In this embodiment, the amorphous silicon germanium thin film is formed on the substrate 11 to which the positive bias of 200 V or less is concurrently applied.

Figure 6:
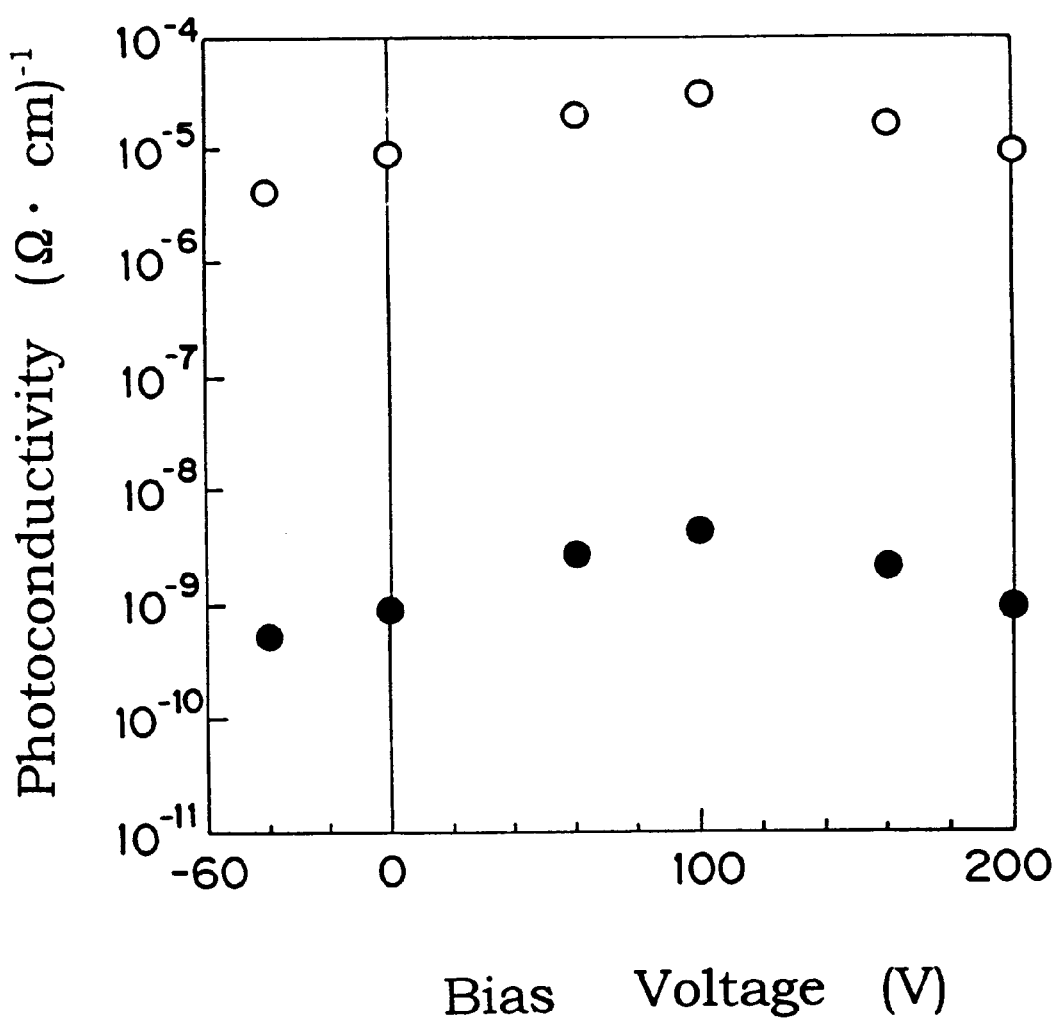
FIG. 6 is a graph showing a relationship between the voltage applied to the substrate and the photoconductivity of the resulting thin film.

FIG. 6 is a graph of photoconductivity vs. voltage applied for the amorphous silicon germanium thin films formed with the varied voltages applied to the substrates. The thin-film forming conditions selected when the plasma CVD technique was employed to form those amorphous silicon germanium thin films are as follows: substrate temperature of 150° C.; RF power density of 30 mW/cm²; $SiH_4$ flow rate of 5 sccm; $GeH_4$ flow rate of 4 sccm; hydrogen flow rate of 250 sccm; and material gas dilution ratio, $[H_2]/[SiH_4]$, of about 50.

As can be appreciated from FIG. 6, the amorphous silicon germanium thin film formed with the applied voltage of 100 V exhibits the highest photoconductivity. Those formed with the increased applied voltages beyond 100 V exhibit decreased photoconductivities. The amorphous silicon germanium thin film exhibits a comparable photoconductivity when formed with the applied voltage exceeding 200 V to when formed with no voltage applied. The amorphous silicon germanium thin film also exhibits a reduced photoconductivity when formed with the negative voltage applied than when formed with no voltage applied. FIG. 6 demonstrated that the preferred voltage applied ranges from about 50 V to about 150 V.

Figure 7:
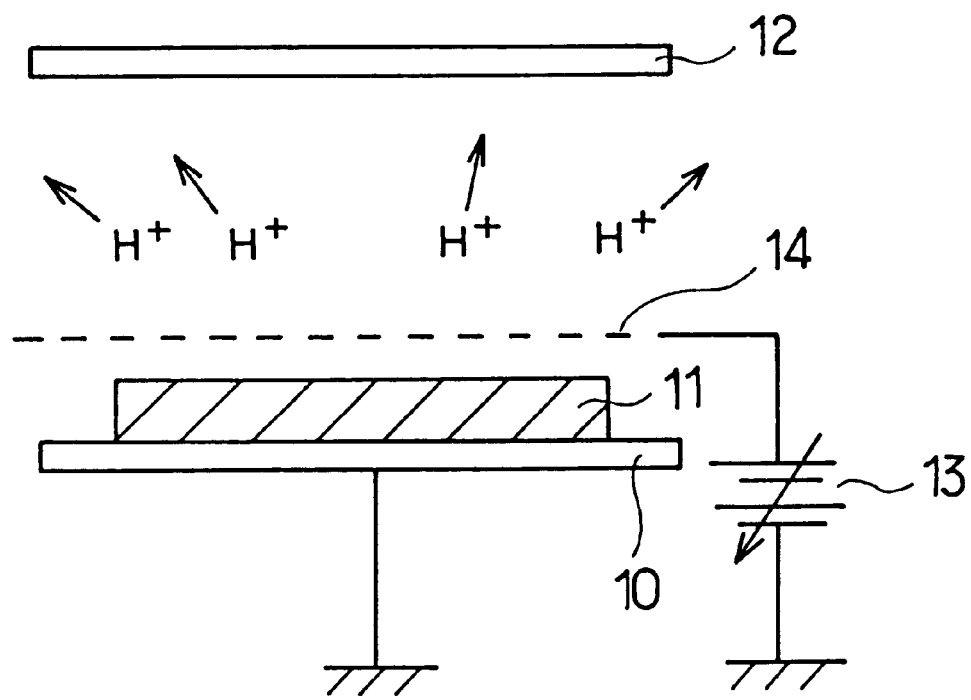
FIG. 7 is a schematic diagram showing the apparatus for applying the positive bias to the metallic mesh disposed above the substrate for use in the method in accordance with the present invention.

FIG. 7 is a schematic diagram of an apparatus for forming the amorphous silicon germanium thin film on the substrate 11 while applying a positive bias to a metallic mesh 12 disposed above the substrate 11. The application of such a positive bias of 200 V or less to the mesh 14 above the substrate 11 also causes the repulsion of hydrogen ions which otherwise strike the substrate 11, serving to reduce damages to the resulting amorphous silicon germanium thin film, so that the amorphous silicon germanium thin film with excellent film properties can be formed.

Figure 8:
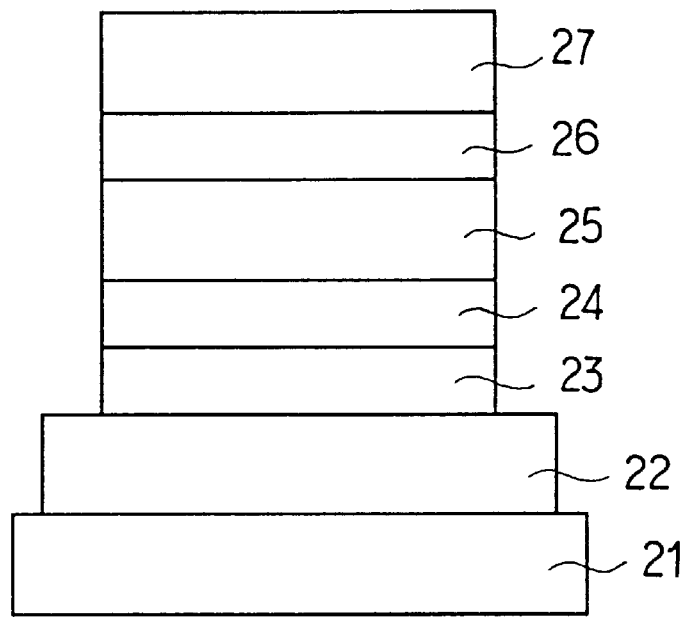
FIG. 8 is a cross-sectional view of one exemplary photovoltaic element incorporating the amorphous silicon germanium thin film fabricated in accordance with the present invention.
Figure 9:
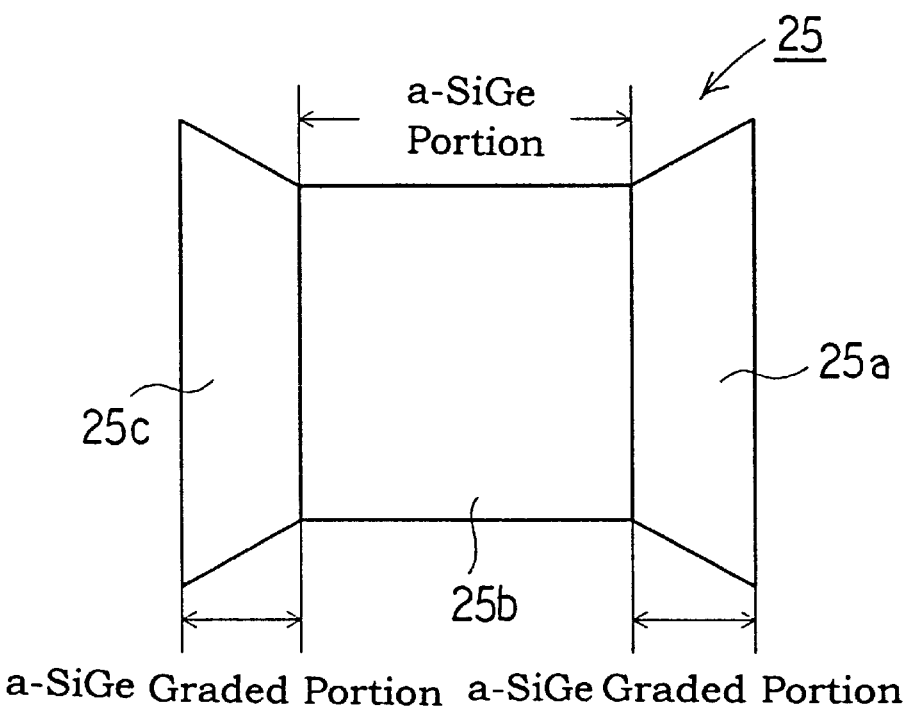
FIG. 9 is a schematic diagram showing the graded structure of i-layer in the photovoltaic element shown in FIG. 8.

FIG. 8 is a schematic cross-sectional view of a photovoltaic element which incorporate, as a photovoltaic layer, the amorphous silicon germanium thin film formed in accordance with the present invention. Referring to FIG. 8, formed on a glass substrate 21 is a transparent electrode 22 comprised of tin oxide. The glow-discharge plasma CVD technique is employed to contact a mixture of $B_2H_6$, $SiH_4$, $CH_4$ and $H_2$ gases with the transparent electrode 22 to form thereon a p-type amorphous silicon carbide (a-SiC) layer 23. A mixture of $SiH_4$, $H_2$ and $CH_4$ gases is then used to form an i-type amorphous silicon carbide layer 24 on the p-type amorphous silicon carbide layer 23 in an attempt to reduce the recombination of carriers at p/i interface. Using a mixture of $SiH_4$, $GeH_4$ and $H_2$, an i-type amorphous silicon germanium (a-SiGe) layer 25 is formed on the i-type amorphous silicon carbide layer 24 in accordance with the method of the present invention. This i-layer 25 is of a multilayer structure having an a-SiGe portion 25b interposed between a-SiGe graded portions 25a and 25c, as shown in FIG. 9 which schematically illustrates a band gap of such a graded i-layer construction.

A mixture of $PH_3$, $SiH_4$ and $H_2$ is employed to form on the i-layer 25 an n-type a-Si layer 26 on which Ag is sputter deposited to form a rear side electrode 27.

In the photovoltaic element of FIG. 8, the p-layer 23 has a thickness of 100 Å, the interfacial i-layer 24 of 100 Å, the graded portion 25a (adjacent to the p-layer 23) of 200 Å, the a-SiGe portion 25b, as constituting the photovoltaic layer, of 800 Å, the graded portion 25c (adjacent to the n-layer 26) of 200 Å, and the n-layer 26 of 100 Å, for example.

The detailed thin-film forming conditions in fabricating the i-layer 25 are given in Table 7.

TABLE 7

|  |  |  | Exp. 2 | Exp. 3 |
|---|---|---|---|---|
| RF Power (mW/cm$^2$) |  |  | 30 | 30 |
| Substrate Temperature (° C.) |  |  | 150 | 150 |
| Pressure (Pa) |  |  | 150 | 150 |
| Bias Voltage (V) |  |  | 100 | 0 |
| Gas | a-Si | 100%SiH$_4$ | 50 | 50 |
| Flow | Portion | H$_2$ | 80 | 80 |
| Rate | a-SiGe | 100%SiH$_4$ | 50 | 50 |
| (sccm) | Graded | H$_2$ | 80→40 | 80→40 |
|  | Portion | 10%GeH$_4$/H$_2$ | 0→40 | 0→40 |
|  | a-SiGe | 100%SiH$_4$ | 5 | 5 |
|  | Portion | H$_2$ | 250 | 250 |
|  |  | 10%GeH$_4$/H$_2$ | 4 | 4 |
|  | a-SiGe | 100%SiH$_4$ | 50 | 50 |
|  | Graded | H$_2$ | 40→80 | 40→80 |
|  | portion | 10%GeH$_4$/H$_2$ | 40→0 | 40→0 |
|  | a-Si | 100%SiH$_4$ | 50 | 50 |
|  | Portion | H$_2$ | 80 | 80 |

As shown in Table 2, two types of photovoltaic elements were fabricated. Specifically, the photovoltaic element of Example 2 was fabricated with the bias voltage of 100 V applied to the substrate, and that of Example 3 was fabricated with no bias voltage applied to the substrate.

The photovoltaic elements of Examples 2 and 3 were respectively measured for conversion efficiency and F.F. under R65 filter, both initially and after photodegradation. The R65 filter is a filter for transmitting selectively the light of 650 nm or more in wavelength. The exposure to a radiation through the R65 filter to cause photodegradation of those photovoltaic elements was carried out in the following conditions: AM 1.5, 125 mW/cm$^2$, 48° C., and 310 hours. The measured results are shown in Table 8.

TABLE 8

|  | Bias Voltage (V) | Initial Conversion Efficiency (%) | Initial F.F. | Conversion Efficiency After Degradation (%) | F.F. After Degradation |
|---|---|---|---|---|---|
| Exp. 2 | 100 | 3.0 | 0.68 | 2.8 | 0.65 |
| Exp. 3 | 0 | 2.8 | 0.63 | 2.6 | 0.60 |

As apparent from Table 8, the photovoltaic element of Example 2, in which the bias voltage of 100 V was applied to the substrate in forming the amorphous silicon germanium thin film, exhibits an increased F.F. as well as an improved conversion efficiency compared to the photovoltaic element of Example 3 in which no bias voltage was applied to the substrate in forming the amorphous silicon germanium thin film. The conversion efficiency after photodegradation is also demonstrated as higher.

As can be appreciated from the above, in forming the amorphous silicon germanium thin film, the striking of hydrogen ions to the substrate can be suppressed by applying the bias voltage to the substrate in accordance with the present invention, to result in formation of the amorphous silicon germanium thin film with excellent film properties. Therefore, in forming the amorphous silicon germanium thin film in accordance with the present invention, the application of bias voltage to the substrate is preferably taken into account as one of the significant contributors to the formation of thin film with excellent film properties, in addition to the adjustment of material gas dilution ratio with the diluent gas such as a hydrogen gas.

Although the substrate for the photovoltaic element of the present invention was described as being comprised of glass in the above embodiments, it is not limiting and the substrate may be comprised of plastics, such as acrylic plastics, or in a film form such as of polyimide. Also, the substrate can be chosen from electrically conductive, ceramic, or other types of substrates as conventionally used in solar cells. Furthermore, the solar cell constructions as described in the above embodiments are not limiting, and various solar cell constructions can be applied to the present invention.

The amorphous silicon germanium thin film formed in accordance with the present method, as well as the amorphous silicon germanium thin film of the present invention, are not limited to the use in photovoltaic elements and can be used in a wide variety of applications such as infrared detectors and semiconductor devices.

In accordance with the method of the present invention, the amorphous silicon germanium thin film with fine film properties can be formed with a relatively low substrate temperature. The film properties of resulting thin films can be controlled by applying the positive bias of not greater than 200 V either to the substrate or to the metallic mesh disposed above the substrate.

Also in accordance with the present method, since the amorphous silicon germanium thin film can be formed with the relatively low substrate temperature of not higher than 200° C., the possible heat damage to underlying layer(s) can be reduced in forming the stacked photovoltaic element. Therefore, the formation of stacked photovoltaic element exhibiting a high conversion efficiency is enabled.

What is claimed is:

1. A photovoltaic element comprising:

a p-type thin film semiconductor layer;

an n-type thin film semiconductor layer; and an i-type thin film semiconductor layer interposed between said p-type and n-type thin film semiconductor layers, at least one of said p-type layer, said n-type layer and said i-type layer comprising an amorphous silicon germanium thin film exhibiting an optical gap in the range of 1.30–1.40 eV and containing hydrogen and germanium in concentrations of 5–10 atomic percent and 40–55 atomic percent, respectively.

2. The photovoltaic element of claim 1, wherein said amorphous silicon germanium thin film exhibits the optical gap in the range of 1.32–1.36 eV and contains hydrogen and germanium in concentrations of 5–8 atomic percent and 45–55 atomic percent, respectively.

3. A method for manufacturing the photovoltaic element of claim 1, wherein a process of fabricating said amorphous silicon germanium thin film comprising the steps of:

diluting a material gas including silicon-containing and germanium-containing component gases with a diluent gas so that a dilution ratio of said diluent gas to said silicon-containing component gas is not less than 25; and forming the amorphous silicon germanium thin film on a substrate by decomposing the material gas through a plasma CVD process.

4. The method of claim 3, wherein in the forming step, said substrate is set at a temperature of not higher than 200° C.

5. The method of claim 3, wherein in the diluting step, said diluent gas is a hydrogen gas, an inert gas or a mixture thereof.

6. A photovoltaic element having at least two photovoltaic unit structures stacked on each other;

each of said photovoltaic unit structures comprising a p-type thin film semiconductor layer, an n-type thin film semiconductor layer and an i-type thin film semiconductor layer interposed between said p-type and n-type thin film semiconductor layers; and at least one of said p-type layer, said n-type layer and said i-type layer in any of at least one photovoltaic unit structure succeeding outwardly from the photovoltaic unit structure closest to the light incidence plane comprising an amorphous silicon germanium thin film, said thin film exhibiting an optical gap in the range of 1.30–1.40 eV and containing hydrogen and germanium in concentrations of 5–10 atomic percent and 40–55 atomic percent, respectively.

7. The photovoltaic element of claim 6, wherein said amorphous silicon germanium thin film exhibits the optical gap in the range of 1.32–1.36 eV and contains hydrogen and germanium in concentrations of 5–8 atomic percent and 45–55 atomic percent, respectively.

8. A method for manufacturing the photovoltaic element of claim 6, wherein a process of fabricating said amorphous silicon germanium thin film comprising the steps of:

diluting a material gas including silicon-containing and germanium-containing component gases with a diluent gas so that a dilution ratio of said diluent gas to said silicon-containing component gas is not less than 25; and forming the amorphous silicon germanium thin film on a substrate by decomposing the material gas through a plasma CVD process.

9. The method of claim 8, wherein in the forming step, said substrate is set at a temperature in the range of 140–200° C.

10. The method of claim 8, wherein in the diluting step, said diluent gas is a hydrogen gas, an inert gas or a mixture thereof.

* * * * *